(12) United States Patent
Goodwin

(10) Patent No.: US 6,689,521 B1
(45) Date of Patent: Feb. 10, 2004

(54) METHOD AND APPARATUS FOR CONTROL OF PHOTORESIST PLASMA REMOVAL

(75) Inventor: Greg Goodwin, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 10 days.

(21) Appl. No.: 10/099,109

(22) Filed: Mar. 15, 2002

(51) Int. Cl.[7] ............................. G03F 7/36; G03F 7/40; B08B 6/00; C25F 1/00; H01L 21/06
(52) U.S. Cl. .................. 430/30; 430/313; 430/327; 430/328; 430/329; 134/1.2; 134/1.3; 438/5; 438/9
(58) Field of Search .................. 430/30, 329, 313, 430/327, 328; 216/59, 67; 34/1.2, 1.3; 438/5, 9

(56) References Cited

U.S. PATENT DOCUMENTS

| | | | |
|---|---|---|---|
| 5,989,763 A | * 11/1999 | Bendik et al. ............... | 430/30 |
| 6,379,980 B1 | * 4/2002 | Toprac ......................... | 438/9 |
| 6,423,457 B1 | * 7/2002 | Bell ............................. | 430/30 |
| 6,560,506 B2 | * 5/2003 | Toprac ......................... | 438/5 |
| 6,586,262 B1 | * 7/2003 | Saito et al. .................. | 438/9 |

* cited by examiner

Primary Examiner—Richard L. Schilling
(74) Attorney, Agent, or Firm—Williams, Morgan & Amerson, P.C.

(57) ABSTRACT

The present invention provides for a method and an apparatus for controlling plasma photoresist removal processes. At least one manufacturing run of semiconductor devices is processed. Environmental data is acquired in response to processing the semiconductor devices. Metrology data is acquired in response to processing the semiconductor devices. The method further comprises performing residual gas analysis based upon the acquired environmental data and the acquired metrology data.

9 Claims, 6 Drawing Sheets

METHOD AND APPARATUS FOR CONTROL OF PHOTORESIST PLASMA REMOVAL

BACKGROUND OF THE INVENTION

1. Field of the Invention

This invention relates generally to semiconductor products, and, more particularly, to a method and apparatus for controlling semiconductor manufacturing processes to remove photoresist plasma.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and, therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Among the important aspects in semiconductor device manufacturing are rapid thermal anneal (RTA) control, chemical mechanical polishing (CMP) control, etching, and overlay control.

The results from the analysis of the process errors are used to make updates to process tool settings manually. Generally, a manufacturing model is employed to control the manufacturing processes. Some of the problems associated with the current methods include the fact that the process tool settings are only updated a few times a month. Furthermore, currently the process tool updates are generally performed manually. Many times, errors in semiconductor manufacturing are not organized and reported to quality control personnel. Often, the manufacturing models themselves incur bias errors that could compromise manufacturing quality.

Generally, a set of processing steps is performed on a lot of wafers on a semiconductor manufacturing tool called an exposure tool or a stepper, followed by processing of the semiconductor wafers in etch tools. The manufacturing tool communicates with a manufacturing framework or a network of processing modules. The manufacturing tool is generally connected to an equipment interface. The equipment interface is connected to a machine interface to which the stepper is connected, thereby facilitating communications between the stepper and the manufacturing framework. The machine interface can generally be part of an advanced process control (APC) system. The APC system initiates a control script based upon a manufacturing model, which can be a software program that automatically retrieves the data needed to execute a manufacturing process. Often, semiconductor devices are staged through multiple manufacturing tools for multiple processes, generating data relating to the quality of the processed semiconductor devices. Many times, errors can occur during the processing of semiconductor devices. There are many manufacturing side effects that can affect the quality and efficiency of processed semiconductor wafers. These manufacturing side effects include plasma-induced electrical charges that can damage semiconductor devices being manufactured.

The present invention is directed to overcoming, or at least reducing the effects of, one or more of the problems set forth above.

SUMMARY OF THE INVENTION

In one aspect of the present invention, a method is provided for controlling plasma photoresist removal processes. At least one manufacturing run of semiconductor devices is processed. Environmental data is acquired in response to processing the semiconductor devices. Metrology data is acquired in response to processing the semiconductor devices. The method further comprises performing residual gas analysis based upon the acquired environmental data and the acquired metrology data.

In another aspect of the present invention, an apparatus is provided for controlling plasma photoresist removal processes. The apparatus of the present invention comprises: a processing chamber; a residual gas analyzer coupled with the processing chamber, the residual gas analyzer capable of detecting at least one type of residual gas in the processing chamber; and a processing tool controller coupled with the processing chamber and the residual gas analyzer, the processing tool controller being capable of terminating an operation of the processing chamber in response to a signal from the residual gas analyzer.

BRIEF DESCRIPTION OF THE DRAWINGS

The invention may be understood by reference to the following description taken in conjunction with the accompanying drawings, in which like reference numerals identify like elements, and in which.

Figure 1:
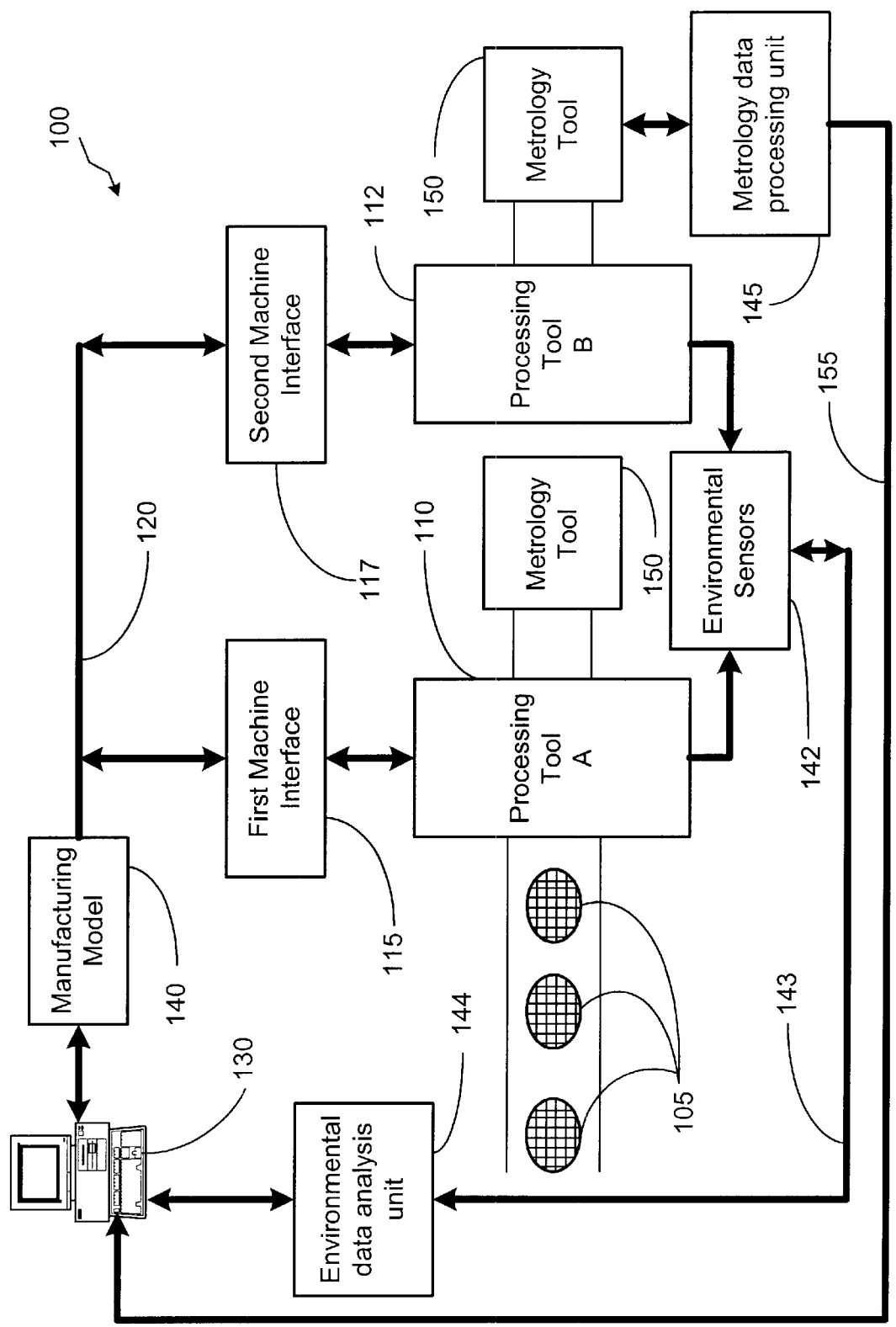
FIG. 1 illustrates one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, semiconductor devices are stepped through multiple manufacturing process tools. As semiconductor devices are processed through manufacturing tools, production data, or manufacturing data, is generated. The production data can be used to perform fault detection analysis that can lead to improved manufacturing results. Overlay and etching processes are important groups of process steps in semiconductor manufacturing. In particular, metrology data, including manufacturing data, is acquired after manufacturing processes, such as photolithography and photoresist etching processes, are substantially completed. The metrology data can be used to make adjustments to manufacturing processes for subsequent manufacturing runs of semiconductor devices, such as semiconductor wafers. Environmental factors can affect the quality and performance of the semiconductor wafers. Environmental factors include plasma charges that are developed during the plasma photoresist removal process. The present invention provides a method and an apparatus for preventing excess plasma photoresist removal processing.

Turning now to FIG. 1, one embodiment of the present invention is illustrated. In one embodiment, semiconductor products, such as semiconductor wafers 105, are processed on processing tools 110, 112 using a plurality of control input signals on a line 120. In one embodiment, the control input signals on the line 120 are sent to the processing tools 110, 112 from a computer system 130 via machine interfaces 115, 117. In one embodiment, the first and second machine interfaces 115, 117 are located outside the processing tools 110, 112. In an alternative embodiment, the first and second machine interfaces 115, 117 are located within the processing tools 110, 112.

In one embodiment, the computer system 130 sends control input signals on a line 120 to the first and second machine interfaces 115, 117. The computer system 130 employs a manufacturing model 140 to generate the control input signals on the line 120. In one embodiment, the manufacturing model 140 contains a recipe that determines a plurality of control input parameters that are sent on the line 120.

In one embodiment, the manufacturing model 140 defines a process script and input control that implement a particular manufacturing process. The control input signals on a line 120 that are intended for processing tool A 110 are received and processed by the first machine interface 115. The control input signals on a line 120 that are intended for processing tool B 112 are received and processed by the second machine interface 117. Examples of the processing tools 110, 112 used in semiconductor manufacturing processes are steppers, scanners, step-and-scan tools, and etch process tools. In one embodiment, processing tool A 110 and processing tool B 112 are photolithography process tools, such as steppers.

The system illustrated in FIG. 1 includes environmental sensors 142 that acquire environmental data from processing tool A 110 and processing tool B 112. The environmental data that is collected includes barometric pressure during process operation, readings of certain gases present during process operation, ambient temperature conditions, the relative humidity during process operation, and the presence of plasma charges due to excessive oxygen plasma photoresist removal processing. Environmental data from the environmental sensors 142 is sent to the environmental data analysis unit 144 via a line 143. The environmental data analysis unit 144 organizes and correlates the environmental data from the environmental sensors 142 and sends the environmental data to the computer system 130, where it is stored. In one embodiment, the environmental data analysis unit 144 is a software program that is integrated into the computer system 130.

For processing tools 110, 112, such as steppers, the control inputs, on the line 120, that are used to operate the processing tools 110, 112 include an x-translation signal, a y-translation signal, an x-expansion wafer scale signal, a y-expansion wafer scale signal, a reticle magnification signal, and a reticle rotation signal. Generally, errors associated with the reticle magnification signal and the reticle rotation signal relate to one particular exposure process on the surface of the semiconductor wafer 105 being processed in the exposure tool. For processing tools 110, 112, such as etch process tools, the control inputs on the line 120 include an etch time-period control signal, an etch temperature control signal, and an etch pressure control signal.

For photolithography processes, when a process step in a processing tool 110, 112 is concluded, the semiconductor wafer 105 that is being processed, is examined in a review station. One such review station is a KLA review station. One set of data derived from the operation of the review station is a quantitative measure of the amount of misregistration that was caused by the previous exposure process. In one embodiment, the amount of misregistration relates to the misalignment in the process that occurred between two layers of a semiconductor wafer 105. In one embodiment, the, amount of misregistration that occurred can be attributed to the control inputs for a particular exposure process. The control inputs generally affect the accuracy of the process steps performed by the processing tools 110, 112 on the semiconductor wafer 105. Modifications of the control inputs can be utilized to improve the performance of the process steps employed in the manufacturing tool. Many times, the errors that are found in the processed semiconductor wafers 105 can be correlated to a particular fault analysis and corrective actions can be taken to reduce the errors.

Figure 2:
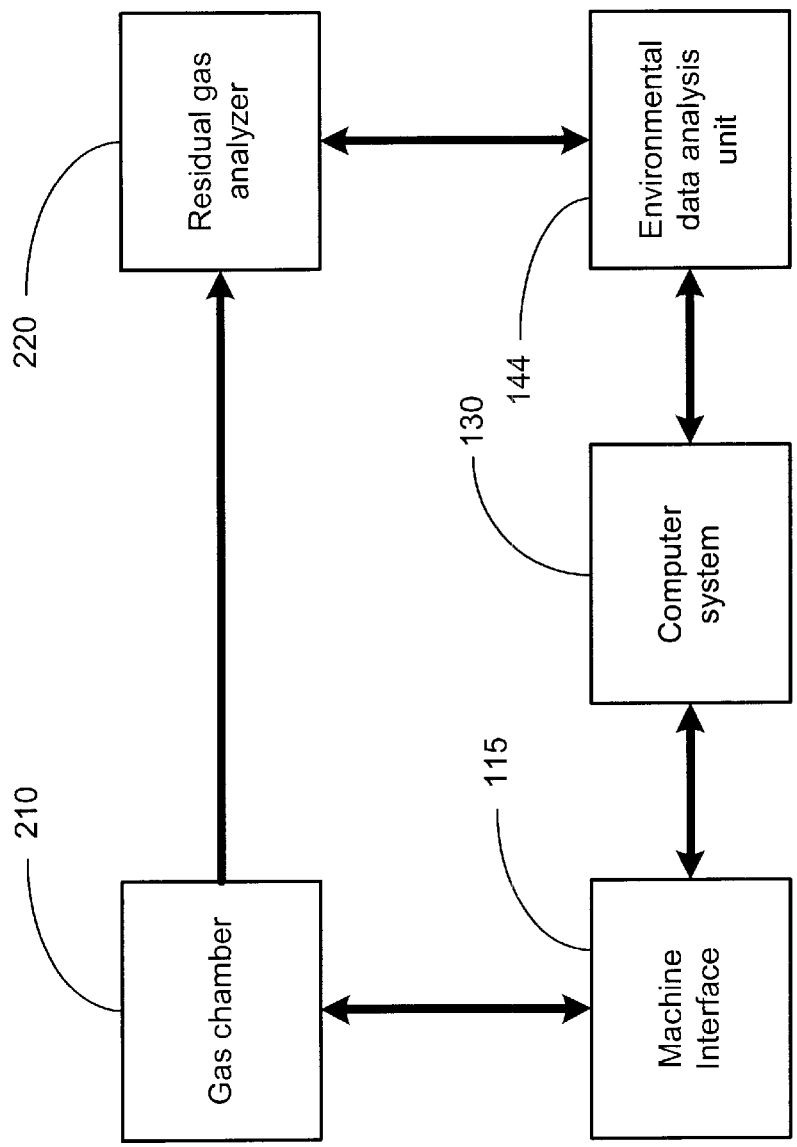
FIG. 2 illustrates a more detailed depiction of the apparatus in accordance with the present invention.

Turning now to FIG. 2, a more detailed embodiment of the apparatus in accordance with the present invention is illustrated. The computer system 130 controls a gas chamber 210 via the machine interface 115. In one embodiment, the gas chamber 210 is a processing tool 110, 112 that removes excess photoresist material. In one embodiment, the gas chamber 210 comprises an oxygen plasma stripper that is used to remove excess photoresist material from semiconductor wafers 105 that are being processed. A residual gas analyzer 220 is interfaced with the gas chamber 210. In one embodiment, the residual gas analyzer 220 monitors the semiconductor wafers 105 being processed for excess photoresist material and excess byproduct gases.

When the residual gas analyzer 220 does not detect an appreciable amount of residual gas and the metro logy tool 150, as shown in FIG. 1, does not detect an appreciable amount of photoresist material, the residual gas analyzer 220, in conjunction with the environmental data analysis unit 144, causes the computer system 130 to shut off the plasma photoresist removal process. In one embodiment, the residual gas analyzer 220 is a semiconductor manufacturing process residue-gas detector known by those skilled in the art that have the benefit of the present invention. In one embodiment, the computer system 130 is integrated into the APC framework. In effect, the residual gas analyzer 220 monitors the semiconductor wafers 105 being processed and causes the APC framework to shut down the plasma photoresist removal process in response to a determination that there is no excess photoresist material on the semiconductor wafers 105.

Figure 3:
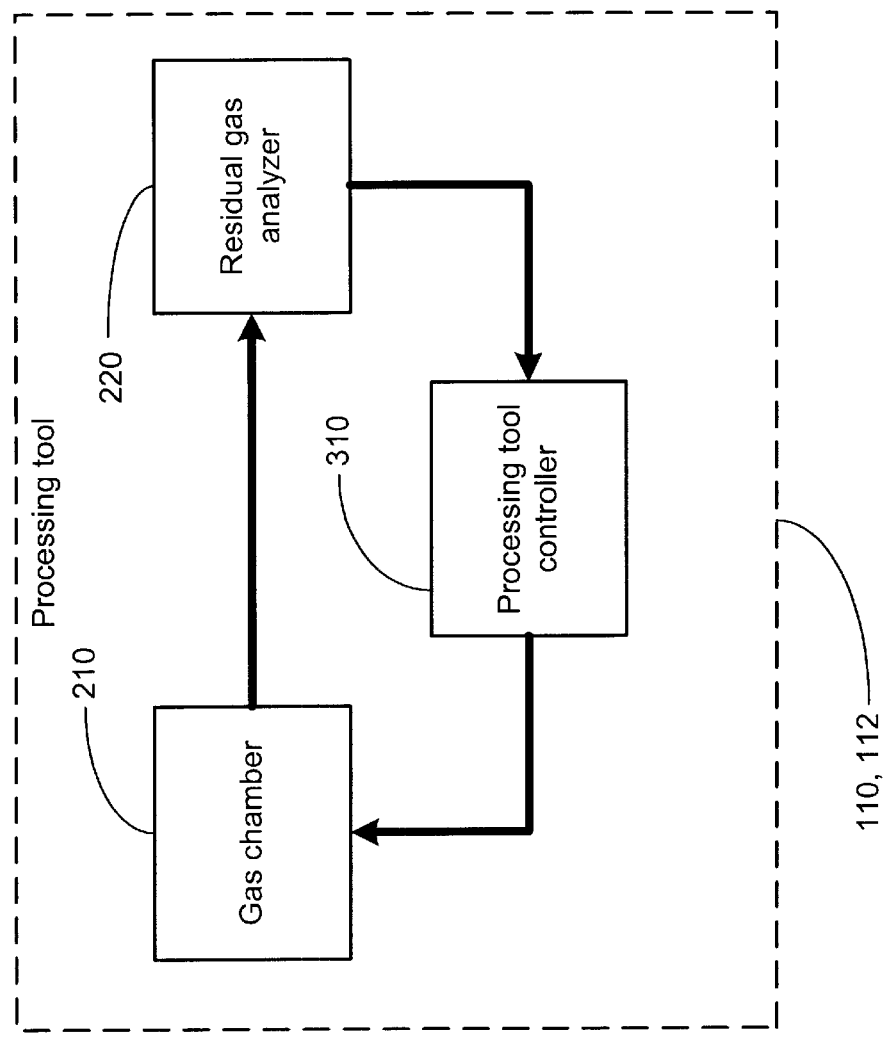
FIG. 3 illustrates an alternative depiction of the apparatus in accordance with the present invention.

Turning now to FIG. 3, an alternative embodiment of the apparatus in accordance with the present invention is illustrated. The processing tool 110, 112 illustrated in FIG. 3 comprises A gas chamber 210 (or a processing chamber), a residual gas analyzer 220, and a processing tool controller 310. In one embodiment, the processing tool controller 310 is interfaced with the machine interface 115 and is controlled by the computer system 130 via the machine interface 115.

As described in FIG. 2, the gas chamber 210 is capable of performing oxygen plasma photoresist removal processes. The residual gas analyzer 220 monitors the semiconductor wafers 105 being processed for the existence of excess photoresist material. When the residual gas analyzer 220 makes a determination that there is no excess photoresist material on the semiconductor wafer 105 being processed, a signal indicating the lack of excess photoresist material is sent to the processing tool controller 310. The processing tool controller 310 is capable of terminating the plasma photoresist removal process in response to the signal from the residual gas analyzer 220 that there is no excess photoresist material on the semiconductor wafers 105 being processed.

Figure 4:
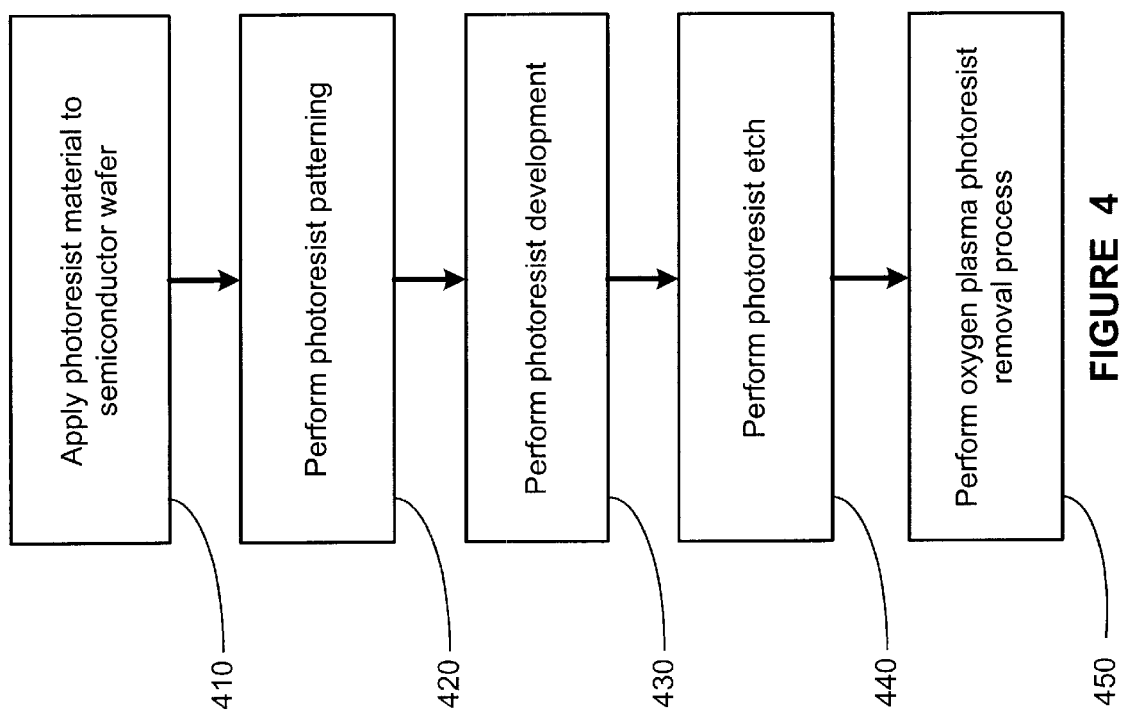
FIG. 4 illustrates a flowchart illustration of the process steps that are affected by the teachings of the present invention.

Turning now to FIG. 4, a flowchart depiction of the semiconductor processing steps that are affected by the teachings of the present invention is illustrated. A predetermined thickness of photoresist material is deposited upon the surface of a semiconductor wafer 105 that is being processed, as described in block 410 of FIG. 4. The semiconductor wafer 105 is then sent to a photoresist patterning stage, as described in block 420 of FIG. 4. The semiconductor wafer 105 is exposed to a light source using a reticle to pattern the surface of the semiconductor wafer 105, which is generally performed by a processing tool 110, 112 that is a stepper tool.

After the photoresist patterning stage, the semiconductor wafer is sent to a photoresist development stage, as described in block 430 of FIG. 4. In one embodiment, exposed photoresist material is removed during the photoresist development stage. After the photoresist development process is performed, a photoresist etch process is performed, as described in block 440 of FIG. 4. The photoresist patterns are etched to precise critical dimensions during the photoresist etch process. Subsequently, an oxygen plasma photoresist removal process is performed on the semiconductor wafer 105, as described in block 450 of FIG. 4. The oxygen plasma photoresist removal process removes excess photoresist material after the processing of the semiconductor wafer 105. Generally, oxygen plasma photoresist removal processes are performed based upon a predetermined time period, which can cause excess operation of the oxygen plasma photoresist removal process. Excess oxygen plasma photoresist removal processing can damage the semiconductor wafer 105 that is being processed. The present invention provides for a method and means for preventing, or at least reducing the effects of, excess oxygen plasma photoresist removal processing.

Figure 5:
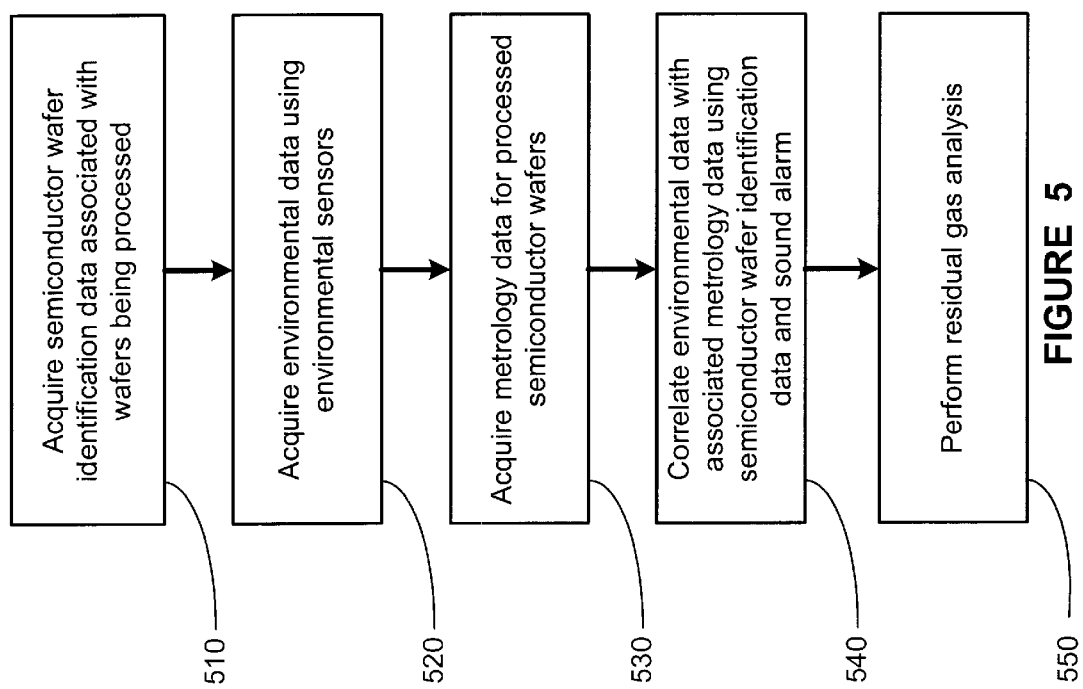
FIG. 5 illustrates one embodiment of a flowchart illustration of the steps that comprise the methods taught by the present invention.

Turning now to FIG. 5, wafer identification data associated with the processed semiconductor wafers 105 is acquired, as described in block 510. The wafer identification data that is acquired includes semiconductor wafer set number, date coding, manufacturing coding, and the like. In one embodiment, the wafer identification data is stored in the computer system 130. Environmental data associated with the processed semiconductor wafers. 105 is acquired using the environmental sensors 142, as described in block 520 of FIG. 5. The environmental data that is acquired may include plasma charges that are created by excessive oxygen plasma photoresist removal processing. The environmental data is collected and organized by the environmental data analysis unit 144. In one embodiment, the environmental data is then stored in memory associated with the computer system 130.

Once the semiconductor wafers 105 are at least partially processed, metrology data relating to the processed semiconductor wafers 105 is acquired, as described in block 530 of FIG. 5. The processed semiconductor wafers 105 are sent to the metrology tool 150, which performs metrology data acquisition upon the processed semiconductor wafers 105. The metrology data that is acquired may include critical dimension data, photolithography misregistration data, excessive photoresist material, and the like. Once the metrology data is acquired, the metrology data processing unit 145 collects and organizes the metrology data. In one embodiment, the metrology data processing unit 145 is a software program that is integrated into the computer system 130. The acquired metrology data is stored in memory associated with the computer system 130.

In one embodiment, the environmental data is correlated with the corresponding metrology data, as described in block 540 of FIG. 5. In one embodiment, the wafer identification data is used to perform the correlation between the environmental data and the corresponding metrology data. The quality of the processed semiconductor wafers is examined by analyzing the metrology data. Certain characteristics, such as abnormal critical dimension measurements, can then be correlated to particular characteristics of the environmental data. Correlation of defects on the semiconductor wafers 105 and plasma charges due to excessive plasma photoresist removal processing can be performed using the environmental data and the metrology data. Using this correlation, a corrective feedback algorithm can be developed by those skilled in the art to compensate for the effects of certain manufacturing environmental factors. Subsequently, a residual gas analysis is performed, as described in block 550 of FIG. 5.

Figure 6:
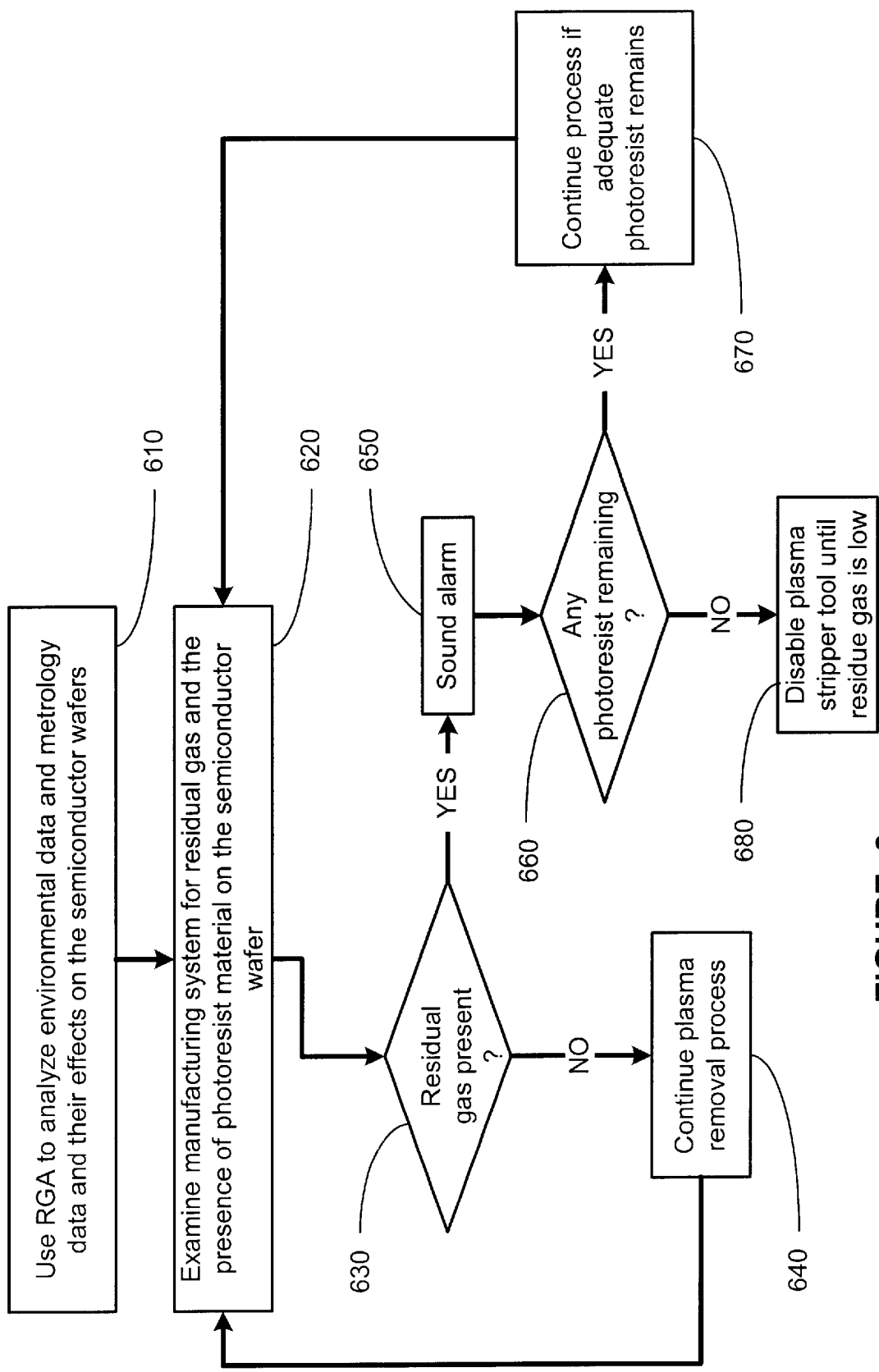
FIG. 6 illustrates one embodiment of a more detailed flowchart of the steps of performing residual gas analysis described in FIG. 5.

Turning now to FIG. 6, a more detailed flowchart depiction of the step of performing residual gas analysis is illustrated. A residual gas analyzer 220 is used to analyze the environmental data and metrology data relating to a plasma photoresist removal process, as described in block 610 of FIG. 6. The manufacturing system 100, particularly the gas chamber 210, is examined for residual gas, such as oxygen ($O_2$), and the presence of excess photoresist material on the semiconductor wafer 105, as described in block 620 of FIG. 6. A determination is made whether residual gas is present in the manufacturing system 100, as described in block 630 of FIG. 6. When a determination is made that there is no appreciable amount of residual gas present in the manufacturing system 100, the plasma photoresist removal process is continued, as described in block 640 of FIG. 6. Subsequently, the process of examining the manufacturing system 100 for residual gas and the presence of photoresist material is repeated, as indicated in FIG. 6.

When a determination is made that there are appreciable amounts of residual gas present in the manufacturing system 100, an alarm is sounded indicating the presence of residual gas, as described in block 650. The alarm can be used to manually or automatically shut down or alter the semiconductor wafer 105 processing steps. A determination is then made whether appreciable amounts of excess photoresist material are present on the semiconductor wafer 105 being processed, as described in block 660 of FIG. 6. When a determination is made that an appreciable amount of excess photoresist material is present on the semiconductor wafers 105 being processed, the plasma photoresist removal process is continued, as described in block 670 of FIG. 6. Subsequently, the process of examining the manufacturing system 100 for residual gas and the presence of photoresist material is repeated, as indicated in FIG. 6.

When a determination is made that an appreciable amount of excess photoresist material is not present on the semiconductor wafers 105 being processed, the processing tool 110, 112 that performs plasma photoresist removal is disabled, as described in block 680 of FIG. 6. The disabling of the processing tool 110, 112 that performs plasma photoresist removal reduces the existence of plasma charges that can damage the semiconductor wafers 105 being processed.

The principles taught by the present invention can be implemented in a process control system, such as an Advanced Process Control (APC) Framework. The APC is a preferred platform from which to implement the overlay control and etch process control strategy taught by the present invention. In some embodiments, the APC can be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller and etch process controller. The control methods are generally defined and performed in these scripts. The development of these scripts can comprise a significant portion of the development of a control system.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

processing at least one manufacturing run of semiconductor devices;

acquiring environmental data in response to processing said semiconductor devices;

acquiring metrology data in response to processing said semiconductor devices; and performing residual gas analysis based upon said acquired environmental data and said acquired metrology data.

2. The method described in claim 1, wherein performing a process run of semiconductor devices further comprises processing semiconductor wafers.

3. The method described in claim 2, wherein processing semiconductor wafers further comprises performing a photolithography process on said semiconductor wafers.

4. The method described in claim 3, wherein performing a photolithography process further comprises performing a plasma photoresist removal process on said semiconductor wafers.

5. The method described in claim 1, wherein acquiring environmental data in response to processing said semiconductor devices further comprises acquiring residual gas data.

6. The method described in claim 1, wherein acquiring metrology data in response to processing said semiconductor devices further comprises determining whether there is excess photoresist material on said semiconductor device.

7. The method described in claim 1, wherein performing residual gas analysis further comprises:

determining whether there exists an appreciable amount of residual gas during the processing of said semiconductor devices; and disabling a plasma removal process based upon a determination that there are appreciable amounts of residual gas present during the processing of said semiconductor devices.

8. The method described in claim 7, further comprising the step of sounding an alarm in response to a determination that appreciable amounts of residual gas are present during the processing of said semiconductor device.

9. The method described in claim 1, wherein performing residual gas analysis further comprises:

determining whether there are appreciable amounts of photoresist material during a plasma photoresist removal process step; and disabling a plasma photoresist removal process in response to a determination that there are no appreciable amounts of photoresist material during a plasma photoresist removal process step.

* * * * *

UNITED STATES PATENT AND TRADEMARK OFFICE
CERTIFICATE OF CORRECTION

PATENT NO.    : 6,689,521 B1
DATED         : February 10, 2004
INVENTOR(S)   : Greg Goodwin It is certified that error appears in the above-identified patent and that said Letters Patent is hereby corrected as shown below:

<u>Column 4,</u>
Line 39, replace "the," with -- the --.
Line 64, replace "metro logy" with -- metrology --.

<u>Column 5,</u>
Line 16, replace "Figure 3 comprises A" with -- Figure 3 comprises a --.

<u>Column 6,</u>
Line 8, replace "wafers." with -- wafers --.

Signed and Sealed this

First Day of June, 2004

JON W. DUDAS
*Acting Director of the United States Patent and Trademark Office*